United States Patent [19]

Davis

[11] Patent Number: 4,709,216

[45] Date of Patent: Nov. 24, 1987

[54] OPERATIONAL AMPLIFIER WITH PASSIVE CURRENT LIMITING

[75] Inventor: William F. Davis, Tempe, Ariz.

[73] Assignee: Motorola, Inc., Schaumburg, Ill.

[21] Appl. No.: 880,534

[22] Filed: Jun. 30, 1986

[51] Int. Cl.[4] .............................................. H03F 3/45
[52] U.S. Cl. .................................... 330/252; 330/253; 330/261
[58] Field of Search .............. 330/252, 253, 257, 261, 330/307, 311, 207 P, 298

[56] References Cited

U.S. PATENT DOCUMENTS 4,063,185 12/1977 Kojima et al. .................. 330/261 X
4,308,504 12/1981 Ida ........................................ 330/253

Primary Examiner—Eugene R. LaRoche
Assistant Examiner—Steven J. Mottola
Attorney, Agent, or Firm—Vincent B. Ingrassia

[57] ABSTRACT

An improved operational amplifier circuit having an all NPN output stage includes a sense resistor in the output stage for developing a voltage thereacross proportional to any short circuit current flowing in the output stage. A diode clamp is coupled to the base of the emitter follower transistor which is in turn coupled between the input stage and the output stage for diverting base current from the base of the follower transistor when a sufficient voltage drop appears across the sense resistor.

6 Claims, 2 Drawing Figures

OPERATIONAL AMPLIFIER WITH PASSIVE CURRENT LIMITING

BACKGROUND OF THE INVENTION

This invention relates generally to operational amplifiers, and more particularly, to an operational amplifier integrated circuit having an all NPN output stage and including passive current limiting circuitry.

An operational amplifier including an output stage comprised of all NPN transistors is shown and described in U.S. Pat. No. 4,403,200 issued Sept. 6, 1983 and entitled output stage for operational amplifier. In this circuit, all of the NPN transistors are activated in order to sink current. It is therefore necessary to provide circuitry which prevents these transistors from being damaged when the output is shorted to one of the supply rails. A solution used in the past involves sensing the short circuit current flowing into the output terminal and utilizing this current in a feedback loop so as to deprive base current flowing into the second stage and output stage transistors. Specifically, a sense resistor $R_{SC}$ senses the short circuit current flowing into the output node. When the voltage drop across this sense resistor reaches the base emitter voltage of, for example a PNP transistor, the transistor turns on causing current to flow through its emitter-collector path to a diode. An additional transistor is coupled in a current mirror configuration with the diode and has a collector coupled to the base of the second stage follower transistor. Thus, the current flowing through the diode is mirrored at the collector of the additional transistor thus diverting base current from the second stage.

Unfortunately, the two transistors, diode and interconnect metal consume significant die area. Furthermore, the resulting circuitry represents a feedback loop which under certain conditions could oscillate. This requires the inclusion of additional compensation circuitry to render the current limit circuit frequency stable.

SUMMARY OF THE INVENTION

It is an object of the present invention to provide an improved operational amplifier circuit.

It is a further object of the present invention to provide an operational amplifier circuit which includes passive current limiting in the event that the output terminal is shorted to one of the supply rails.

It is a still further object of the present invention to provide an operational amplifier circuit wherein current limiting is accomplished without the necessity of an output-to-input feedback loop.

Yet another object of the present invention is to provide an operational amplifier circuit wherein current limiting is accomplished without sensing the short circuit current at the output terminal.

A still further object of the present invention is to provide an improved operational amplifier integrated circuit incorporating current limiting in the event of a short circuit to one of the supply rails which is simpler and occupies less area on the integrated circuit.

According to a broad aspect of the invention there is provided an operational amplifier circuit including an input stage for receiving a differential input signal, an output stage, and at least one emitter follower transistor coupled between the output of the input stage and the input of the output stage. A diode clamping circuit is coupled to the base of the emitter follower transistor and is responsive to the voltage thereat for limiting said voltage to a predetermined value.

The above and other objects, features, and advantages of the present invention will be more clearly understood from the following detailed description taken in conjunction with the accompanying drawings, in which:

DESCRIPTION OF THE PREFERRED EMBODIMENT

Figure 1:
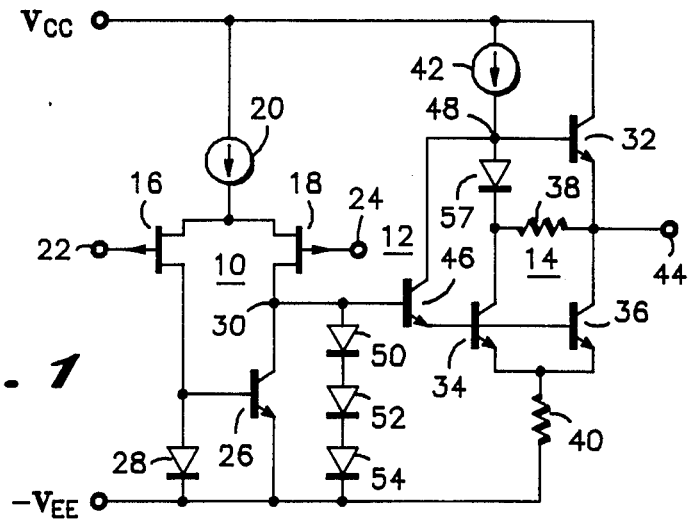
FIG. 1 is a schematic diagram of a first embodiment of the inventive operational amplifier.

FIG. 1 is a schematic diagram of a first embodiment of the inventive operational amplifier circuit. It comprises an input stage 10, a second or gain stage 12, and an output stage 14. The input stage 10 includes a differential pair of JFET transistors 16 and 18 each having their sources coupled together and to a first source of supply voltage $V_{CC}$ via current source 20. The gate electrodes of transistors 16 and 18 are coupled to input terminals 22 and 24 which receive a differential input signal. Input stage 10 also includes a current mirror circuit comprised of NPN transistor 26 and diode 28. Both the cathode of diode 28 and the emitter of transistor 26 are coupled to a second source of supply voltage $(-V_{EE})$. The base of transistor 26 is coupled to the anode of diode 28 and to the collector of transistor 16. The collector of transistor 26 is coupled to the collector of transistor 18 forming output node 30 of input stage 10.

Output stage 14 comprises first, second and third NPN transistors 32, 34 and 36, resistor 38 coupled between the collectors of transistors 34 and 36, diode 57 coupled between the collector of transistor 34 and the base of transistor 32, and sense resistor 40 coupled between the emitters of transistors 34 and 36 and the second source of supply $(-V_{EE})$. The collector of transistor 34 is coupled via current source 42 to the first source of supply $(V_{CC})$. Transistor 32 has a collector coupled to $V_{CC}$ and an emitter coupled to the collector of transistor 36 and to output terminal 44. Transistor 32 may be considered a pull-up or source transistor while transistors 34 and 36 may be considered the pull-down or sink transistors.

The second current gain stage 12 comprises NPN transistor 46 coupled in an emitter follower configuration. That is, the base of transistor 46 is coupled to output node 30 of input stage 10. The collector of transistor 46 is coupled to node 48 and the emitter of transistor 46 is coupled to the base electrodes of transistors 34 and 36. For reasons to be described hereinbelow, the series arrangement of three diodes 50, 52, and 54 are coupled between the base of emitter follower 46 and the second source of supply $(-V_{EE})$.

Ignoring for the moment the effects of unwanted short circuit current at output terminal 44, the amplifier shown in FIG. 1 operates in the typical manner. For example, if the voltage at input terminal 22 were lower than that at input terminal 24, more current would flow in the collector of transistor 16 than would flow in the collector of transistor 18. Due to the current mirror action of diode 28 and transistor 26, transistor 26 would attempt to sink at its collector an amount greater than that flowing in the collector of transistor 18. Thus, the voltage at node 30 would fall causing transistor 46 to remain in a nonconductive state. With transistor 46 off, pull-down transistors 34 and 36 will remain off while current from current source 42 would flow in to the base of pull-up transistor 32 rendering it conductive. As a result, the voltage at output terminal 44 would rise.

If, on the other hand, the voltage at input terminal 24 were lower than that at input terminal 22, more current would flow in the collector of transistor 18 than would be sunk by the collector of transistor 26 causing the voltage at node 30 to rise. This would cause transistor 46 to be rendered conductive thus diverting current from current source 42 to cause pull-down transistors 34 and 36 to be rendered conductive which, in turn, causes the voltage at output terminal 44 to fall.

As can be seen, sense resistor 40 is positioned between the emitters of pull-down transistors 34 and 36 and the negative rail such that any short circuit current, such as would result from shorting output terminal 44 to the positive rail, would flow through transistors 34 and 36. However, the total short circuit current would flow through sense resistor 40. Thus, if the differential input at terminals 22 and 24 were such that most of the tail current from current source 20 were flowing through transistor 18, transistors 46, 34 and 36 would be rendered highly conductive. Thus, as the short circuit current flowing through sense resistor 40 increases, the voltage drop across resistor 40 would likewise increase. This would cause the emitters of transistors 34 and 36 to rise in potential with respect to $-V_{EE}$ which in turn would cause the base of transistors 34 and 36 and therefore the emitter of transistor 46 to also rise in potential. It follows therefore that the base of transistor 46 would likewise rise in potential. However, as soon as the potential at the base of transistor 46 became equivalent to three diode voltage drops above $-V_{EE}$, diodes 50, 52 and 54 would become forward biased thus clamping the voltage at the base of transistor 46 at three diode voltage drops. The remainder of the tail current flowing into node 30 is diverted from the base of transistor 46 and flows through diodes 50, 52 and 54.

It should be apparent that since the diodes of 50, 52 and 54 limit the voltage at the base of transistor 46 to approximately three times the base emitter voltage of a transistor, then the voltage across resistor 40 must be approximately equal to the base-emitter voltage of a transistor (i.e. one diode drop). Therefore, the voltage across resistor 40 is the same as the base-emitter voltage of transistor 34 or transistor 36. The current through resistor 40 is then fixed at approximately a diode drop divided by the resistance of resistor 40. As a result, the current through each of transistors 34 and 36 is fixed at approximately one half of the current flowing through resistor 40. Thus, the short circuit current has been limited.

The above current limit technique is accomplished without the need for feedback and therefore does not suffer from potential oscillation. It is simpler than the prior art approach requiring only three diodes which are easy to fabricate and may be localized on the semiconductor die. Since the need for feedback has been eliminated, there is no need for long metal conductors from the output terminal 44 back to the base of transistor 46. This is significant in that the area consumed by the metal conductor may exceed the area occupied by the devices themselves.

Figure 2:
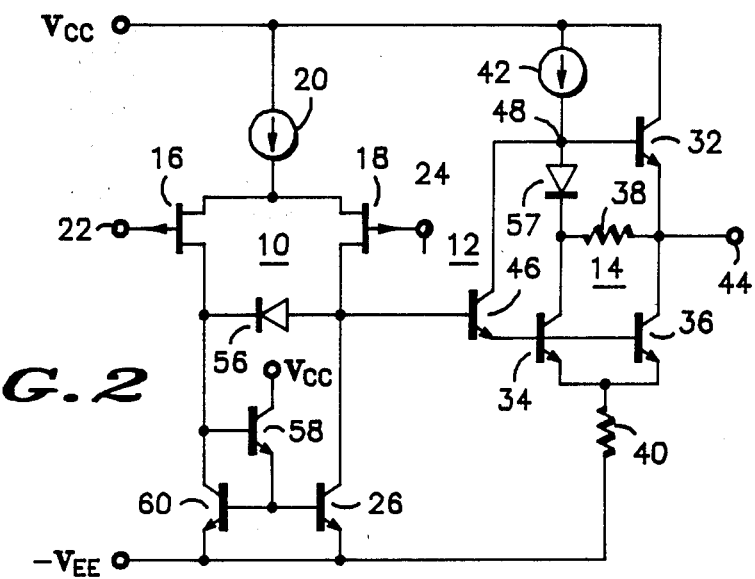
FIG. 2 is a schematic diagram of a second embodiment of the inventive operational amplifier circuit.

FIG. 2 is a schematic diagram of another embodiment of the inventive operational amplifier wherein like elements are denoted with like reference numerals. As can be seen, the diode string of FIG. 1 is not present in the circuit of FIG. 2. However, a diode 56 has been added with its anode coupled to the collector of transistor 18 and its cathode coupled to the collector of transistor 16. The current mirror circuit has been altered and includes, in addition to transistor 26, NPN transistors 58 and 60. Transistor 60 has a base coupled to the base of transistor 26, an emitter coupled to the negative rail and a collector coupled to the collector of transistor 16 and to the cathode of diode 56. Transistor 58 has a base coupled to the collector of transistor 60, an emitter coupled to the bases of transistors 26 and 60, and a collector coupled to the positive rail ($V_{CC}$). Generally, the connection of transistors 58 and 60 is comparable to the diode means usually forming a portion of a well known current mirror wherein the diode is connected in parallel with the base-emitter of an output transistor 26 as was shown in FIG. 1. Transistor 58 operates in the well known manner to suppress base current errors otherwise associated with NPN transistors 60 and 26. As should be apparent, the base of transistor 58 resides at a potential which is $2V_{BE}$ above the negative rail where $V_{BE}$ is the base emitter voltage of a transistor.

Absent a large short circuit current, the emitters of transistors 34 and 36 are very near in potential to the negative rail; i.e. the voltage drop across resistor 40 is very small. Thus, the voltage at the base of transistor 46 is approximately $2V_{BE}$. Therefore, the anode and cathode of diode 56 are at approximately the same potential. If most of the tail current generated by current source 20 is flowing through transistor 18, there is little current in the mirror and therefore almost all the tail current is flowing into the base of transistor 46. This drives transistor 46 and renders it highly conductive which further renders transistors 34 and 36 highly conductive. Should a short circuit current now be applied to output terminal 44, a very large current will be conducted by transistors 34 and 36 causing the voltage drop across resistor 40 to increase as was the case previously. This will cause the voltage at the base of transistor 46 to rise as before. Since the base of transistor 58 is clamped at $2V_{BE}$, and since the forward voltage drop across diode 58 is approximately equal to $V_{BE}$ then the base of transistor 46 can only rise to $3V_{BE}$. As soon as diode 56 becomes forward biased and starts to conduct, current is provided to the mirror circuit causing transistor 26 to turn on. In so doing, transistor 26 diverts current from the base of transistor 46.

Thus, the circuit of FIG. 2 achieves a passive current limiting without feedback through the addition of only a single resistor 40 and a single diode 56.

The above description is given by way of example only. Changes in form and details may be made by one skilled in the art without departing from the scope of the invention as defined by the appended claims.

I claim:

1. An operational amplifier circuit, comprising:
   an input stage having first and second inputs for receiving a differential input signal and having an output;
   an output stage having an input and having an output terminal;
   at least a first emitter follower transistor coupled between the output of said input stage and the input of said output stage, said first emitter follower transistor having a base coupled to the output of said input stage, a collector for coupling to a first source of supply voltage and an emitter coupled to the input of said output stage;

diode clamping means coupled to the base of said first emitter follower transistor and responsive to the voltage thereat for limiting said voltage to a predetermined value; and first means for sensing short circuit current flowing in through said output stage, said output stage comprising first, second and third NPN transistors, said first transistor having a collector for coupling to said first source of supply voltage and an emitter coupled to said output terminal, said second and third transistors each having a collector coupled to said output terminal, each having a base coupled to the emitter of said emitter follower transistor, and each having an emitter coupled to said first means, the collector of said second transistor being coupled to the base of said first transistor.

2. A circuit according to claim 1 wherein said first means comprises a resistor having a first terminal coupled to the emitters of said second and third transistors and having a second terminal for coupling to a second source of supply voltage.

3. A circuit according to claim 2 wherein said diode clamping means comprises first, second and third series coupled diodes coupled between the base of said emitter follower transistor and said second source of supply voltage for diverting current from the base of said emitter follower transistor.

4. A circuit according to claim 2 wherein said input stage comprises:

a first JFET having a gate coupled to said first input, a source coupled to said first source of supply voltage and having a drain;

a second JFET having a gate coupled to said second input, a source for coupling to said first source of supply voltage and a drain coupled to the base of said emitter follower transistor; and current mirror means for coupling between said second source of supply voltage and the drains of said first and second JFETs.

5. A circuit according to claim 4 wherein said diode clamping means comprises a diode having an anode coupled to the source of said second JFET and a cathode coupled to the source of said first JFET.

6. A circuit according to claim 5 wherein said current mirror means comprises:

fourth, fifth and sixth NPN transistors, said fourth transistor having a base coupled to the drain of said first JFET and to the cathode of said diode, a collector for coupling to said first source of supply voltage and an emitter, said fifth transistor having a collector coupled to the base of said fourth transistor and to the drain of said first JFET, an emitter for coupling to said second source of supply voltage and a base coupled to the emitter of said fourth transistor, said sixth transistor having a base coupled to the emitter of said fourth transistor, a collector coupled to the drain of said second JFET and an emitter for coupling to said second source of supply voltage.

* * * * *